United States Patent
Limmer et al.

(10) Patent No.: US 9,874,422 B2
(45) Date of Patent: Jan. 23, 2018

(54) STATIONARY AND MOBILE TEST DEVICE FOR MISSILES

(71) Applicant: MBDA Deutschland GmbH, Schrobenhausen (DE)

(72) Inventors: Michael Limmer, Rehling (DE); Thomas Gallhauser, Pfaffenhofen (DE); Michael Alois Surauer, Chieming (DE); Christian Surauer, Chieming (DE); Franz Geidek, Aresing (DE)

(73) Assignee: MBDA Deutschland GmbH, Schrobenhausen (DE)

( * ) Notice: Subject to any disclaimer, the term of this patent is extended or adjusted under 35 U.S.C. 154(b) by 0 days.

(21) Appl. No.: 15/048,202

(22) Filed: Feb. 19, 2016

(65) Prior Publication Data
US 2016/0252328 A1   Sep. 1, 2016

(30) Foreign Application Priority Data
Feb. 27, 2015 (DE) .......................... 10 2015 002 587

(51) Int. Cl.
*F41G 7/00* (2006.01)
*B64C 27/08* (2006.01)
*G06F 17/50* (2006.01)

(52) U.S. Cl.
CPC .............. *F41G 7/002* (2013.01); *B64C 27/08* (2013.01); *F41G 7/001* (2013.01); *F41G 7/005* (2013.01); *G06F 17/5009* (2013.01)

(58) Field of Classification Search
CPC .......... F41G 7/001; F41G 7/002; F41G 7/004; F41G 7/005; F41G 7/007; F42B 15/08; F42B 30/006; B64C 27/08
See application file for complete search history.

(56) References Cited

U.S. PATENT DOCUMENTS 3,857,042 A * 12/1974 LaGrange ............... F41G 7/005
                                                                244/3.16
4,266,173 A *  5/1981 McTigue ................ F41G 7/222
                                                                318/585

(Continued)

FOREIGN PATENT DOCUMENTS

DE       32 38 897 A1    4/1984
DE       3238897 A1 *    4/1984    ............. F41G 7/004

(Continued)

OTHER PUBLICATIONS

Aviation Week blog, "Unmanned K-max gets cleverer", Aug. 12, 2013, 2 pages, downloaded from http://aviationweek.com/blog/unmanned-k-max-gets-cleverer.*

(Continued)

*Primary Examiner* — Behrang Badii
*Assistant Examiner* — David A Testardi
(74) *Attorney, Agent, or Firm* — Crowell & Moring LLP

(57) ABSTRACT

A stationary test device for a missile includes a retaining device for an avionics testpiece of the missile, where the retaining device enables a movement of the avionics testpiece in three rotational degrees of freedom, and a display device configured to display information on the missile surroundings, where the display device is configured to be moved inside a virtual plane by a translational carriage system. The display device can be detected by the avionics testpiece if the avionics testpiece is disposed on the retaining device. A mobile test device for the missile includes a flight platform, a carrier device mounted on the flight platform, for an avionics testpiece of the missile, wherein the carrier device enables a movement of the avionics testpiece in three rotational degrees of freedom, and a control module, where the control module is configured to control the flight platform for taking off on a specified reference trajectory, control the carrier device for orientation of the avionics testpiece, and store navigation data generated by the avion- (Continued)

ics testpiece. Finally, a test system for the missile includes the stationary test device and the mobile test device.

6 Claims, 2 Drawing Sheets

(56) References Cited

U.S. PATENT DOCUMENTS

| | | | | | |
|---|---|---|---|---|---|
| 4,291,848 | A | * | 9/1981 | Clark | F41G 7/2213 244/3.16 |
| 4,490,724 | A | * | 12/1984 | Bickman | F16M 11/123 343/765 |
| 4,802,640 | A | * | 2/1989 | Reid | F41G 7/2213 244/3.19 |
| 4,860,016 | A | | 8/1989 | Westphal et al. | |
| 5,247,843 | A | * | 9/1993 | Bryan | F42B 35/00 250/492.1 |
| 5,279,479 | A | * | 1/1994 | Adama | F42B 15/01 244/3.16 |
| 5,592,850 | A | * | 1/1997 | Rowan | F41G 7/004 73/167 |
| 6,386,886 | B1 | * | 5/2002 | Filaretos | H01R 39/10 439/21 |
| 8,415,596 | B2 | * | 4/2013 | Dold | F41G 7/007 244/3.1 |
| 8,897,931 | B2 | * | 11/2014 | Spinelli | G05D 1/0061 434/28 |
| 2003/0071165 | A1 | * | 4/2003 | Fiebick | F41G 7/007 244/3.1 |
| 2011/0301784 | A1 | | 12/2011 | Oakley et al. | |
| 2015/0276364 | A1 | * | 10/2015 | Sato | F42B 15/08 701/3 |

FOREIGN PATENT DOCUMENTS

| | | | | |
|---|---|---|---|---|
| DE | 36 37 000 A1 | | 5/1988 | |
| DE | 10 2011 115 963 B3 | | 10/2012 | |
| GB | 2117957 A | * | 10/1983 | F41J 2/02 |
| JP | 2000266499 A | * | 9/2000 | |
| WO | WO 2006075158 A1 | * | 7/2006 | G01M 9/062 |

OTHER PUBLICATIONS

Clements, Jim et al., "Non-destructive missile seeker flight testing: HWIL in the sky", Technologies for Synthetic Environments: Hardware-in-the-Loop Testing XV, edited by James A. Buford, Jr., Robert Lee Murrer, Jr., Proc. of SPIE vol. 7663, Paper 76630E, © 2010 SPIE, 8 pages.*

EPO machine translation of JP 2000-266499 (original JP document published Sep. 29, 2000).*

Ewing, Craig M., "The Advanced Guided Weapon Testbed (AGWT) at the Air Force Research Laboratory Munitions Directorate", AIAA Modeling and Simulation Technologies Conference, Aug. 10-13, 2009, Chicago, Illinois, Paper AIAA 2009-6129, 13 pages.*

Jollie, William B., "Airborne Seeker Evaluation and Test System", Proceedings of SPIE vol. 1482, Acquisition, Tracking, and Pointing V, 1991, pp. 92 to 103.*

Marcotte, Frank J. et al., "An Airborne Captive Seeker with Real-Time Analysis Capability" Johns Hopkins APL Technical Digest, vol. 18 No. 3, 1997, pp. 422-431.*

Marcotte, Frank J. et al., "The APL Guidance System Evaluation Laboratory", Johns Hopkins APL Technical Digest, vol. 22 No. 3, 2001, pp. 324 to 332.*

Ricks, Timothy P. et al., "Stabilized electro-optical airborne instrumentation platform (SEAIP)", Chemical and Biological Standoff Detection, edited by James O. Jensen, Jean-Marc Theriault, Proceedings of SPIE vol. 5268, 2004, pp. 202 to 209.*

German-language Office Action issued in German counterpart application No. 10 2015 002 587.2 dated Oct. 30, 2015 (Six (6) pages).

European Search Report issued in European counterpart application No. 16000133.5-1811 dated Jul. 5, 2016, with Statement of Relevancy (Eleven (11) pages).

Gao Wei et al.: "Study on electro-optical jamming effect on TV seekers by flight test", Optomechatronic Micro/Nano Devices and Components III: Oct. 8-10, 2007, Lausanne, Switzerland; [Proceedings of SPIE, ISSN 0277-786X], SPIE, Bellingham, Wash, vol. 9233, Jul. 14, 2014, 6 total pages, XP060040199.

Sanders et al.: "Captive flight test-based infrared validation of a hardware-in-the-loop simulation", Proceedings of the SPIE—The International Society for Optical Engineering, Orlando, Florida, USA, vol. 4027, Apr. 26, 2000, pp. 292-300, XP002759044.

Smith B J et al.: "Precision dynamic SAR testbed for tactical missiles", Aerospace Conference, 2004. Proceedings. 2004 IEEE, Piscataway, NJ, USA, vol. 4, Mar. 6, 2004, pp. 2220-2226, XP010748343.

* cited by examiner

STATIONARY AND MOBILE TEST DEVICE FOR MISSILES

CROSS REFERENCE TO RELATED APPLICATIONS

This application claims priority under 35 U.S.C. §119 from German Patent Application No. 10 2015 002 587.2, filed Feb. 27, 2015, the entire disclosure of which is herein expressly incorporated by reference.

FIELD OF THE INVENTION

The present invention relates to a test system for a missile. In particular, the invention relates to a stationary test device as well as a mobile test device for a missile.

BACKGROUND AND SUMMARY OF THE INVENTION

The following abbreviations are used for describing the invention:
  GNC: Guidance, Navigation and Control
  NGC: Navigation, Guidance and Control
  IMU: Inertial Measurement Unit
  GPS: Global Positioning System
  CAS: Control Actuator System
  LOS: Line of Sight
  VTOL: vertical take off and landing
  OLED: organic light emitting diode
  DoF: Degree of freedom It is known from the prior art that, for the development of missiles, it is frequently necessary to carry out flight tests. In this case such flight tests are a cost driver in the development of missiles, which needs to be reduced in particular in order to increase competitiveness. Because of a large number of staff, as well as the required use of equipment, infrastructure and safety aspects, flight tests are associated with high financial expenditure. Especially in the initial phase of a project for missile development, the flight tests sometimes have contrary purposes. This is due to the different requirements of the various disciplines participating in development of a missile. Thus, for example, it is important for the GNC developer to be able to fly as far as possible in order to be able to test the GNC functionality for as long as possible. On the other hand, it is a concern of the image processing development to be able to fly as realistically as possible to a real target in order to obtain image data for the corresponding algorithm. The duration of flight tests is generally much too short to be able to carry out all tests. Experience shows that malfunctions also often occur, so that flight tests cannot provide evidence and therefore have to be repeated. For these reasons there are attempts to avoid flight tests and instead to replace them by laboratory tests.

In conventional "hardware in the loop" testing systems, which take place in a laboratory, rotational degrees of freedom of the missile are simulated with a turntable or a robot. In this case, the "degree of freedom" designates the number of possibilities for movement of the missile which are independent of one another. Thus, the missile has six degrees of freedom, since it is movable in three spatial directions which are independent of one another and is rotatable about three axes which are independent of one another.

However, due to the fixed construction in a laboratory it is a disadvantage that the translational degrees of freedom and all functions associated therewith cannot be tested under realistic conditions. The relative geometry between the missile and a target to which the missile is to fly must be produced artificially, which happens in the prior art for example by values of the missile calculated by simulation. These values are then artificially fed into the missile avionics instead of the actual values. As such, it is important to know the behavior of the relevant systems, such as IMU, seeker head, GPS, etc., during the flight.

In practice, it has been shown that this behavior in the real flight is often substantially different from the behavior which can be observed in the laboratory. Likewise, for optical seeker heads, the geometric conditions which are important for the entire chain of reconstruction of the line of sight and guidance of the line of sight, such as aspect angle, aspect ratio, proximity, image explosion or environmental disturbances, can only be insufficiently and artificially adjusted. If realistic data are required, for example from a seeker head, there is a possibility of carrying out carried flights on man-carrying aircraft, such as an airplane or helicopter. These carried flights are very expensive and often more expensive than real flight tests, due to the high use of resources and safety aspects. For kinematic reasons it is often not possible to achieve real translational trajectories by carried flights, particularly in the case of surface-to-surface missiles.

Furthermore, it is known from the prior art to use unmanned missiles as test objects for navigation software. For this purpose, the missile has a fixed navigation system, wherein in a standardized flight a response by the navigation software can be checked. Such a missile is known for example from DE 10 2011 115 963 B3.

An object of the invention is to provide a stationary test device as well as a mobile test device for a missile which with a simple and cost-effective production enable a safe and reliable, and thereby cost-effective, performance of tests of the missile. Finally, an object of the invention is to provide a test system consisting of the aforementioned test devices.

The object is achieved by a mobile test device for a missile comprising a flight platform, a carrier device and a control module. The flight platform is in particular an unmanned, particularly advantageously a non-man-carrying, flight platform. The carrier device is fastened to the flight platform and serves to receive an avionics testpiece of the missile. In this case the carrier device enables a movement of the avionics testpiece in three rotational degrees of freedom. The line of sight for the avionics testpiece and the relative geometry between the center of gravity of the missile and the center of gravity of the target to be approached can preferably be generated by the carrier device. The control module enables the control of the flight platform for taking off on a predetermined reference trajectory. Moreover the control module makes it possible to activate the carrier device for alignment of the avionics testpiece. Finally the navigation data produced by the avionics testpiece can be stored by the control module. Therefore a flight of the missile can be simulated by the mobile test device, wherein in particular the airspeed of the flight platform does not correspond to the airspeed of the missile. Thus, a simulation of the flight is not possible in real time, but only at a slower speed. The navigation data stored by the control module can be used particularly advantageously for the simulation with the stationary test device according to the invention.

The carrier device of the mobile test device is particularly advantageously a gimbal platform. Thus, a simple and efficient alignment of the avionics testpiece is made possible.

The flight platform is preferably a helicopter. Thus, in particular, the capability for vertical takeoff and landings is provided. The flight platform particularly advantageously has at least two horizontal oriented rotors. Since a status control is necessary for such an arrangement of rotors, the control module, as described above, preferably also performs the activation to the flight platform so that a stable flight with the flight platform is enabled by the status control performed by the control module.

Moreover, the invention relates to a test system for a missile, wherein the test system comprises a stationary test device and a mobile test device, also in particular as described above. The stationary test device comprises, in particular, a retaining device and a display device. The retaining device serves, in particular, to receive an avionics testpiece of the missile, wherein the retaining device enables a movement of the avionics testpiece in three rotational degrees of freedom. The display device serves for presentation of information on the surroundings of the missile. The display device can be moved inside a virtual plane, in particular, by a translational carriage system. Thus, the display device is movable in two translational degrees of freedom, so that two translational degrees of freedom of the missile can be simulated. In this way translational degrees of freedom of the missile perpendicular to a longitudinal axis of the missile, or a sight axis of the avionics testpiece, can be simulated. For this purpose, it is provided that the display device can be detected by the avionics testpiece if the avionics testpiece is disposed on the retaining device. If the display device is moved, as described above, a translational movement of the missile is suggested to the seeker head. The display device itself simulates a translational movement of the missile in a third direction of movement, wherein these third direction of movement is in particular oriented parallel to a longitudinal axis of the missile, or to the sight axis of the avionics testpiece. Thus, an OLED screen may be particularly provided as a display device, on which real-time information on surroundings can be displayed by a video system. In this way, a flight of the missile can be simulated realistically, so that also geometric conditions, such as aspect angle, aspect ratio, proximity, image explosion or environmental disturbances (such as change to the lighting conditions), can be simulated realistically. The synchronously required data for the avionics testpiece, such as in particular IMU data, are preferably artificially fed into the avionics testpiece.

The stationary test device preferably has a control unit. A movement of the retaining device and shifting of the display device can be controlled by the control unit. Moreover, it is preferably provided that the aforementioned video system and thus the display on the display device can be controlled by the control unit. In this way, the take-off on a pre-defined reference trajectory can be simulated, wherein the navigation data generated by the avionics testpiece can be stored by the control unit. Particularly preferably the behavior of the missile during the taking off on the reference trajectory has been simulated beforehand by the mobile test device, according to the invention, so that a realistic control of the movement of the retaining device and the shifting of the display device is made possible by the control unit of the stationary test device.

Finally, it is preferably provided that the retaining device is a turntable or a robot.

The test system is preferably characterized in that the stationary test device can be operated with simulation data which can be obtained from measurement data. In this case the measurement data can be captured during the operation of the mobile test device. Thus a, very accurate simulation is made possible by the stationary test device.

Particularly advantageously it is provided that the simulation data which can be obtained from the measurement data received during of the operation of the mobile test device comprise IMU data, GPS data, CAS data and seeker head data.

Finally, the invention relates to a method for testing missiles, in particular with a test system, as described above. A method according to the invention comprises the following steps: First of all a reference trajectory, in particular a three-dimensional and/or translational reference trajectory, is defined. The reference trajectory preferably simulates a relative geometry between the missile and a target to which the missile should fly. In the next step the take-off on the reference trajectory takes place with a mobile test device. In this case it is provided that an avionics testpiece of the missile is disposed on the mobile test device. Navigation data generated by the avionics testpiece during the take-off on the reference trajectory are particularly advantageously recorded. In a last step a simulation of a movement of the missile takes place with a stationary test device. In this case, the avionics testpiece is disposed on the stationary test device. The simulation takes place with reference to simulation data which are based on the measurement data obtained during the take-off on the reference trajectory with the mobile test device. Thus, a very accurate simulation of the missile is possible, so that a plurality of flight tests can be simulated in advance by the stationary test device.

Further details, advantages and features of the present invention are apparent from the following description of exemplary embodiments with reference to the drawings. In the drawings:

DESCRIPTION OF PREFERRED EMBODIMENTS

Figure 1:
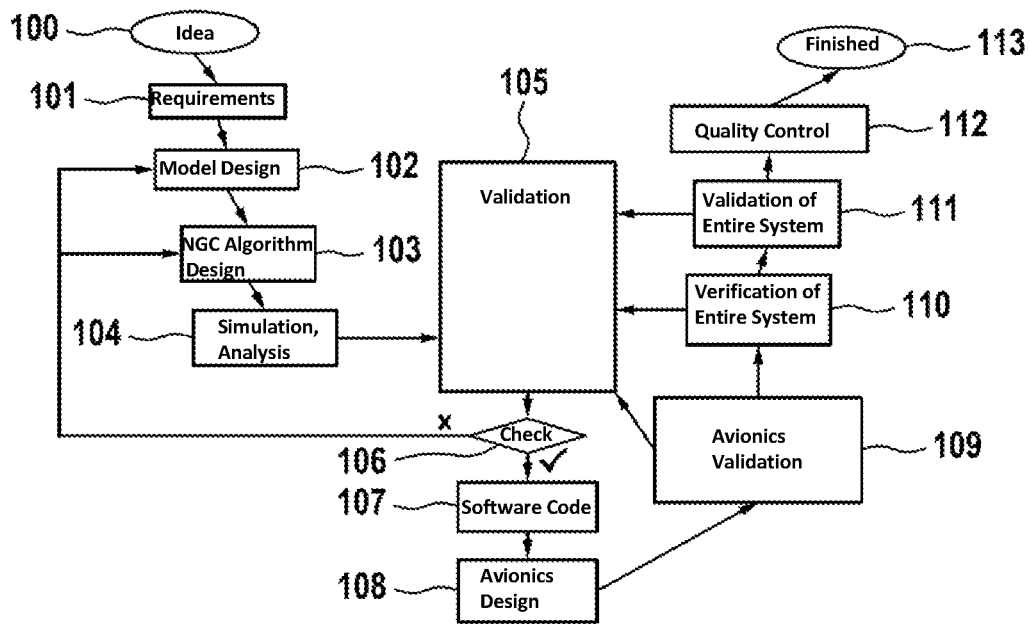
FIG. 1 shows a schematic overall view of a development process for development of missile avionics.

FIG. 1 shows schematically an overview of a product development process of a missile, wherein, starting from an idea 100, a finished product 113 is to be achieved. In this case the definition of requirements 101 takes place in a first step. Then the model design 102 takes place. Next, the designing of the NGC algorithm 103 is carried out so that a simulation analysis 104 can be carried out in a further step. Then, the validation process 105 takes place. If, in a results check 106, the results of this validation process 105 are unsatisfactory, an iterative process takes place by selecting the steps already carried out of model design 102 and designing of the NGC algorithm 103 with subsequent simulation analysis 104, validation process 105 and results check 106. This lasts until satisfactory results of the results check 106 are available.

As soon as satisfactory results are available from the validation process 105, the validation of the software code 107 as well as the designing of the avionics 108 takes place. After the designing of the avionics 108 an avionics validation 109 must take place, wherein after the avionics validation 109 has been carried out the validation process 105 is invoked again.

At the same time, after the avionics validation 109 a verification of the entire system 110 takes place, which likewise leads to the selection of the validation process 105. Then the validation of the entire system 111 takes place, wherein it is likewise possible to return to the validation process 105. Thus, it can be seen that the entire development progress can include a large number of iterations, wherein for the validation process 105 often a plurality of flight tests of the missile often have to be carried out. Should the validation of the entire system 111 proceed successfully, then by means of the quality control 112 the finished product 113 is achieved.

The present invention starts at the step of avionics validation 109, in order here to reduce the plurality of flight tests and in order to be able to simulate a maximum number of tests already in a laboratory. In this case it is provided in particular that laboratory tests can also be carried out in addition to flight tests, so that results obtained by simulation can be confirmed by real tests.

Figure 2:
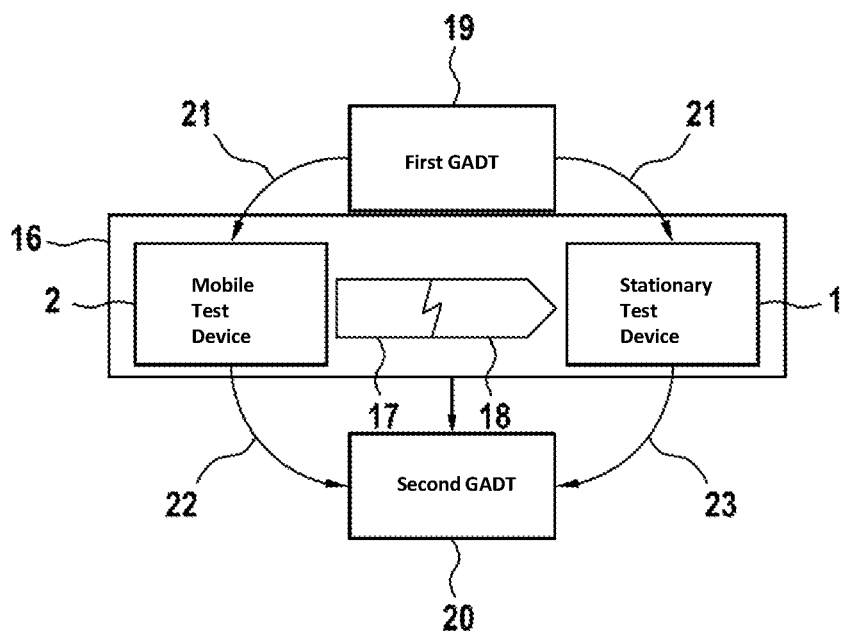
FIG. 2 shows a schematic overall view of a test system according to one exemplary embodiment of the invention.

FIG. 2 shows schematically an overall view of a test system according to one exemplary embodiment of the invention. The test system 16 is also designated as an integrated 6DoF testbench 16, wherein the abbreviation DoF signifies "degree of freedom", and indicates the number of degrees of freedom in which a simulation is possible is.

Moreover, it can be seen from FIG. 2 how the test system 16 co-operates with a generic avionic design tool 19, 20. The term "Generic Avionic Design Tool (GADT)" should be understood as an umbrella term of a software and hardware toolbox which has been applied for the rapid prototyping and for the rapid qualification of flight management systems in the field of missiles. It covers the most varied hardware and software tools which all interrelate. Thus the avionics and the equipment of a missile can be very efficiently tested, graphically represented, evaluated and documented. The Generic Avionic Design Tool 19, 20 is not the subject of this invention.

Figure 3:
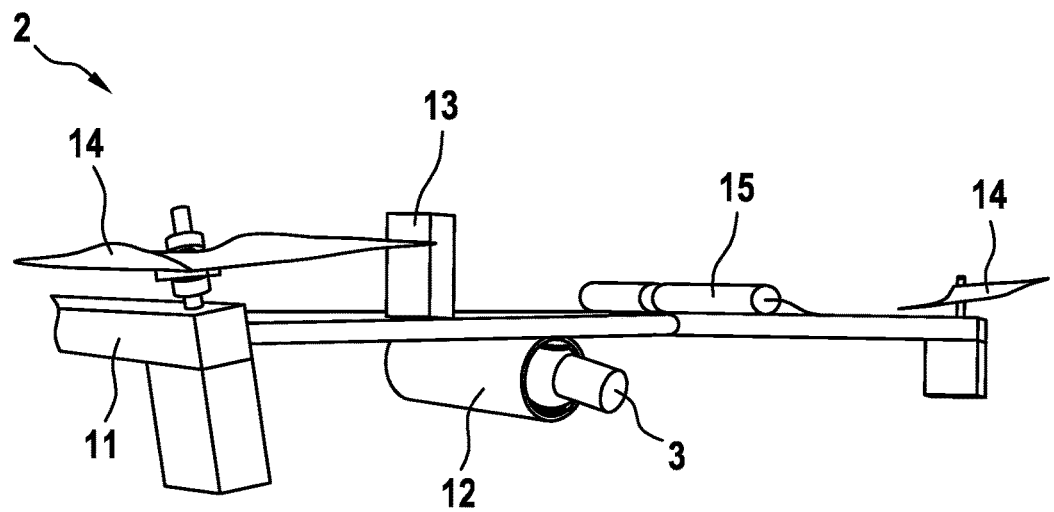
FIG. 3 shows a schematic representation of a mobile test device according to an exemplary embodiment of the invention.

The integrated 6DoF testbench 16 is a new hardware and software component of the Generic Avionic Design Tool toolbox 19, 20 and is a tool for the previously described step "Avionics Equipment & NGC Subsystem Validation", i.e. the step of avionics validation 109. From the GADT toolbox 19, 20, the "GADT Algorithm Design Library" and the "GADT Algorithm Design Environment", which in FIG. 2 are combined as the first GADT 19, are also used for this step. With these two tools the 6DoF of movement of the missile are calculated for a relevant test scenario by simulation and are then supplied by means of a ground station to a flight platform 11, in particular a VTOL platform, which then takes over the synchronization between a translational position and an associated location of the avionics testpiece 3. The precise mode of operation is described below with regard to FIGS. 3 and 4.

Likewise from the GADT toolbox 19, 20 the GADT-Debug & Telemetry System is used in order to capture and store the relevant test data from the avionics testpiece 3. The GADT Postflight Simulation & Validation Tool which is shown in FIG. 2 as second GADT 20 is used in the validation process.

Overall, therefore, after calculation of a reference trajectory 21 by the first GADT 19 it is possible with the test system 16 to carry out flight tests which are divided into carried flight tests with the mobile test device 2 and simulations with the stationary test device 1. The first test data 22 thus obtained by the mobile test device 2 and the second test data 23 obtained by the stationary test device 1 can therefore be used in the validation process with the second GADT 20.

In connection with missile systems or sub-systems the term "validation and verification" is used in the following context:

A verified real system/sub-system is a system in which it has been demonstrated that the system behaves in an error-free manner with regard to its prescribed specification. (Is the system correctly constructed?)

A verified synthetic model of a reference-system/model is a model which behaves in an error-free manner and in the same manner on a signal plane relative to the reference system/model. (Is the model correctly constructed? Does it behave like the reference system/model? Whether the reference system is validated is not important.)

A validated real system/sub-system is a system in which it has been demonstrated that in its actual operational environment the system corresponds to the prescribed requirements. (Is the system functioning correctly?)

A validated synthetic model is a model which on the signal plane behaves in a sufficiently similar manner to the validated real system. (In this case the verification of the synthetic model is a basic prerequisite.)

The integrated 6DoF testbench 16 consists essentially of two parts, the mobile 6DoF testbench 2 and the stationary 6DoF testbench 1.

With the mobile 6DoF test bench 2 it is possible, without the substantial expenditure on staff, safety requirements, infrastructure, etc., to repeatedly carry out cost-effective carried test flight in a realistic environment. In this case measurement data 17 are recorded, which then serve in the laboratory as simulation data 18 and can be analyzed in any way with the stationary 6DoF testbench 1.

Due to the cost-effective reproducibility of the carried flights, on the one hand the conflict described in the introduction of the different requirements and the temporal limitation is resolved in the case of flight tests and supplies data for all requirements. On the other hand, with the integrated 6DOF testbench 16 complex NGC functionality can be tested in order thus to reduce failures in test flights. In particular it is provided that the integrated 6DoF testbench 16 does not replace flight tests, but complements the conventional validation through flight tests.

Mobile 6DoF Testbench 2

First of all, the mobile 6DoF testbench 2 is described. The flight should take place with a flight platform 11, in particular with a VTOL carrier platform on which an avionics testpiece 3 is disposed, on a 3DoF reference trajectory 21 which is determined and programmed by the first GADT 19.

The flight platform 11 preferably comprises two rotors 14 which are offset and horizontally oriented, so as to provide a suitability for vertical takeoff and landing. The avionics testpiece 3 is in particular disposed centrally between the two rotors 14. The flight platform 11 generates the line of sight for the avionics testpiece and the relative geometry between the center of gravity of the missile and the center of gravity of the target to be approached.

The reference trajectory 21 is prepared and transmitted by a ground and control station (not shown) for the flight platform 11, in particular the VTOL carrier platform. The 3DoF reference trajectory 21 simulates the real relative geometry between the missile and a target to be approached. The flight platform 11, in particular the VTOL carrier platform, has a carrier device 12, in particular a 3DoF rotary gimbal platform, in which the avionics testpiece 3 is rotatable is in three degrees of freedom. Thus it is possible to image the actual encounter geometry of a missile in six dimensions in real surroundings. Because of speed restrictions in the flight platform 11, in particular the VTOL carrier platform, the reference trajectory 21 is not flown in real time.

Compliance with the reference trajectory 21 and the temporal co-ordination between position and associated location of the avionics testpiece 3 is performed by a control module 13. In order to be able to store the real test data from the avionics testpiece 3 in the test flight, the control module 13 has a data logger and a measuring module. All of the power required for driving the rotors 14 and for operating the control module 13, the carrier device 12 and the avionics testpiece 3 is provided by a power module 15. The power module 15, just like the control module 13, is disposed on the flight platform 11. In particular the power module 15 comprises an accumulator or a battery for storing electrical power.

The ground and control station (not shown) is the interface for communication purposes between a person operating the mobile test device 2 person and the flight platform 11. It serves to exchange data relating to the flight platform 11 via an up-down link data to interchange and to provide this graphically for the operator. These data serve for controlling and monitoring the flight platform 11.

The control module 13 images the functioning of the flight state control for the flight platform 11 in order to fly on any trajectory, in particular on the reference trajectory 21. Moreover the control module 13 controls the temporal co-ordination between position and location of the avionics testpiece 3. The location is then transmitted as a command to the carrier device 12 and converted, in particular as a gimbal angle. The data logger and the measuring module as a real-time measuring system receive all relevant measurement data of the avionics testpiece 3 in real time on and store these data. In this way the aforementioned measurement data 17 are obtained.

The carrier device 12, in particular the 3D rotary gimbal platform, forms both the mechanical and also the electrical interface between the avionics testpiece 3 and the flight platform 11. The object of the carrier device 12 is to image the location of the avionics testpiece 3, which would occur in the real approach of the missile to be simulated. The location of the avionics testpiece 3 is calculated in advance for the respective test case of the first GADT 19 and delivered to the control module 13 via the ground and control station. The temporal co-ordination and control of the carrier device 12, in particular the rotary gimbal platform, is undertaken by the control module 13.

The mobile 6DoF testbench has the following main objectives:
- Qualification/validation of image processing & NGC sub-functions, in particular of seeker head & IP & image processing, of the navigation system and of guidance & control
- Equipment data acquisition for further processing in the stationary 3DoF testbench 1 and subsequent validation, in particular the seeker head data recording of a real approach (video, IP, SAL) to assist the algorithm development (FoV problems, timing, image processing, . . . ), the IMU data recording, and the GPS data recording Stationary 6DoF Testbench 1

Figure 4:
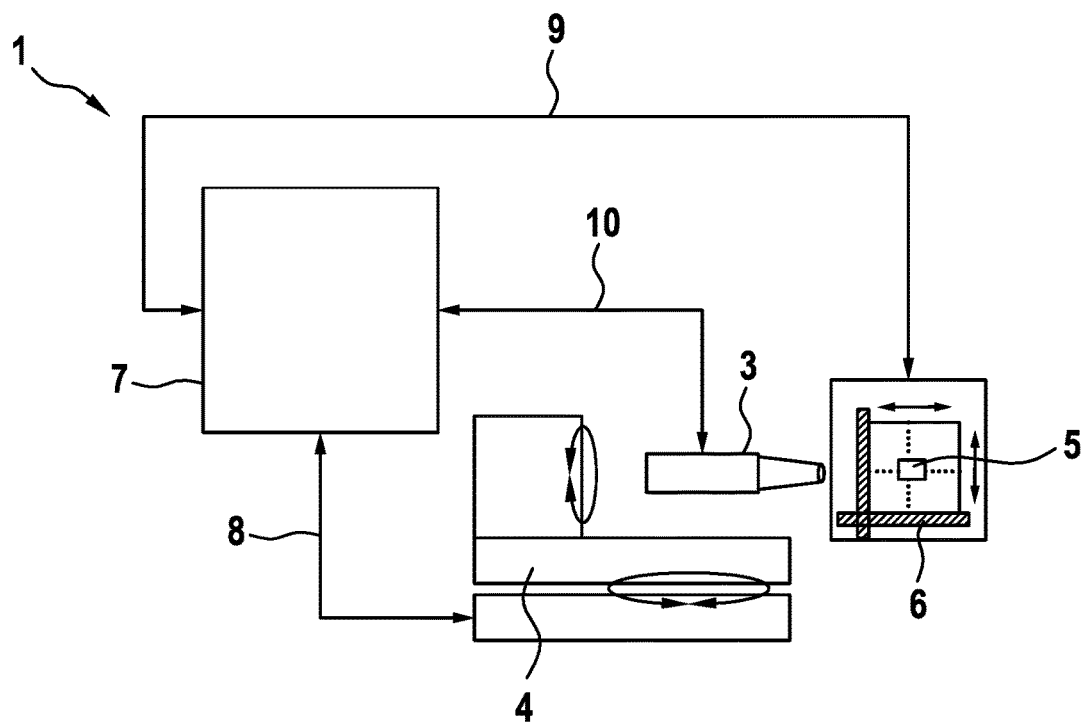
FIG. 4 shows a schematic representation of a stationary test device according to an exemplary embodiment of the invention.

FIG. 4 shows schematically the stationary test device 1 according to an exemplary embodiment of the invention, wherein the stationary test device 1 is also referred to as the stationary 6DoF testbench 1.

The three rotational degrees of freedom of the missile with a retaining device 4, in particular with a 3DoF turntable, are simulated in reality by the stationary 6DoF testbench 1. The two translational degrees of freedom transversely with respect to the line of sight, in particular transversely with respect to a longitudinal axis of the missile, are imaged in reality by a 2DoF translational carriage system 6.

The last translational degree of freedom, the approach to the line of sight, in particular of the longitudinal axis of the missile, and the geometric conditions which can be varied thereby such as aspect angle, aspect ratio, proximity, image explosion, or environmental disturbances such as background, lighting conditions, etc., are displayed in real time by a video system on a display device 5, in particular on an OLED screen. The data required synchronously for the avionics testpiece 3, such as in particular the IMU data, are artificially fed into the avionics testpiece 3. Realistic simulation data 18 are obtained from the measurement data 17 which have been previously acquired by the mobile 6DoF testbench 2. All relevant data, in particular navigation data, from the avionics testpiece 3 are recorded by a control unit 7 and are compared with other test data and validated in the post-flight simulation. For recording of the navigation data of the avionics testpiece 3, this testpiece is connected by a data line 10 to the control unit 7.

For simulation of a flight, the control unit 7 can control the retaining device 4 via a first control line 8 and can control the carriage system 6 via a second control line 9. In particular the control takes place by means of analogue signals. The control of the retaining device 4 and of the carriage system 6 is based on the simulation data 18 obtained from the real measurement data 17. Thus the movement of the avionics testpiece 3 corresponds to a realistic simulation of a flight of the missile.

The stationary 6DoF testbench 1 has the following main objectives:
- Verification of image processing algorithms
- Verification of LOS estimation
- Tuning of LOS synchronization
- IMU/seeker head synchronization
- LOS performance & problems (timing, stability, . . . )
- LOS decoupling
- Boresight error estimation and performance The test system 16, in particular the mobile test device 2 and the stationary test device 1, enable the complete relative geometry and encounter geometry in 6 degrees of freedom of any missile in "slow motion" to be generated in reality by comparison with a stationary target to generate. This is not possible with conventional testing systems for missiles.

Moreover, already before the first flight test open loop as well as closed loop the entire avionics (IMU, seeker head, gimbal, navigation, image processing, . . . ) can be tested and functionalities can be validated in reality.

The invention represents a validated modular avionics sensor system: In advance of future development projects different seeker head-IMU-NGC design can be tested and validated under realistic operating conditions and independently of their future carrier-based missile.

Moreover, flight tests can be supplemented and problems in the algorithms or the avionics-sensor combination can be identified at an early stage. The flight tests can be repeated multiple times for data recording and reproduced for post-flight analysis.

Because of the availability of realistic data both the NGC algorithms and also the image processing algorithms can be developed and optimized better than is possible in the prior art.

Finally the invention offers a high savings potential, because expensive flight tests with real missiles can be reduced, as well as a considerable technical minimization of risk.

In addition to the foregoing written description of the invention, in order to supplement the disclosure thereof reference is hereby made to the drawings representing the invention in FIGS. 1 to 4.

LIST OF REFERENCE NUMERALS 1 stationary test device
2 mobile test device
3 avionics testpiece
4 retaining device
5 display device
6 carriage system
7 control unit
8 first control line
9 second control line
10 data line
11 flight platform
12 carrier device
13 control module
14 rotor
15 power module
16 test system
17 measurement data
18 simulation data
19 first GADT
20 second GADT
21 reference trajectory
22 first test data
23 second test data
100 idea
101 requirements
102 model design
103 NGC algorithm design
104 simulation and analysis
105 validation process
106 results check
107 validating software code
108 avionics design
109 avionics validation
110 verification of the entire system
111 validation of the entire system
112 quality control
113 finished product

What is claimed is:

1. A test system for a missile comprising:
   a mobile test device comprising:
      a flight platform;
      a carrier mounted on the flight platform, for an avionics testpiece of the missile, wherein the carrier enables a movement of the avionics testpiece in three rotational degrees of freedom; and
      a control module configured to:
      control the flight platform for taking off on a specified reference trajectory,
      control the carrier for orientation of the avionics testpiece, and
      store navigation data generated by the avionics testpiece; and
   a stationary test device for a missile comprising:
      a retainer for an avionics testpiece of the missile, wherein the retainer enables a movement of the avionics testpiece in three rotational degrees of freedom, and
      a display configured to display information on surroundings of the avionics testpiece, wherein the display is configured to be moved in a plane by a translational carriage system,
      wherein the display can be detected by the avionics testpiece when the avionics testpiece is disposed on the retainer,
      wherein the stationary test device further comprises a control unit by which a movement of the retainer and a movement of the display is controllable in order to simulate taking off on a pre-defined reference trajectory, and by which navigation data generated by the avionics testpiece can be stored, and
      wherein the stationary test device is operable with simulation data obtained from measurement data captured during the operation of the mobile test device.

2. The test system according to claim 1, wherein the retainer of the stationary test devices is a turntable or a robot.

3. The test system according to claim 1, wherein the simulation data obtained from the measurement data obtained during the operation of the mobile test device comprise Inertial Measurement Unit data, Global Positioning System data, Control Actuator System data and seeker head data.

4. The test system according to claim 1, wherein the carrier comprises a gimbal platform.

5. The test system according to claim 1, wherein the flight platform comprises a helicopter with at least two horizontally oriented rotors.

6. A method for testing missiles with a test system for a missile, the test system comprising:
   a mobile test device comprising:
      a flight platform;
      a carrier mounted on the flight platform, for an avionics testpiece of the missile, wherein the carrier enables a movement of the avionics testpiece in three rotational degrees of freedom; and
      a control module configured to:
      control the flight platform for taking off on a specified reference trajectory,
      control the carrier for orientation of the avionics testpiece, and
      store navigation data generated by the avionics testpiece; and
   a stationary test device for a missile comprising:
      a retainer for an avionics testpiece of the missile, wherein the retainer enables a movement of the avionics testpiece in three rotational degrees of freedom, and
      a display configured to display information on the surroundings of the avionics testpiece, wherein the display is configured to be moved in a plane by a translational carriage system,
      wherein the display can be detected by the avionics testpiece when the avionics testpiece is disposed on the retainer,
      wherein the stationary test device further comprises a control unit by which a movement of the retainer and a movement of the display is controllable in order to simulate taking off on a pre-defined reference trajectory, and by which navigation data generated by the avionics testpiece can be stored, and
      wherein the stationary test device is operable with simulation data obtained from measurement data captured during the operation of the mobile test device, the method comprising:

defining a reference trajectory which is translational and simulates a relative geometry between a missile and a target of the missile;

taking off on the reference trajectory using the mobile test device, wherein an avionics testpiece of the missile is disposed on the mobile test device; and simulating a movement of the missile based on simulation data with the stationary test device, wherein the avionics testpiece is disposed on the stationary test device and wherein the simulation data are based on the measurement data obtained during said taking off on the reference trajectory.

* * * * *